United States Patent
Schultz et al.

(10) Patent No.: US 6,653,726 B1
(45) Date of Patent: Nov. 25, 2003

(54) POWER REDISTRIBUTION BUS FOR A WIRE BONDED INTEGRATED CIRCUIT

(75) Inventors: Richard T. Schultz, Ft. Collins, CO (US); Roger D. Weir, Loveland, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/948,190

(22) Filed: Sep. 7, 2001

(51) Int. Cl.[7] ............................................. H01L 32/52

(52) U.S. Cl. ....................................... 257/691; 257/692

(58) Field of Search ............................... 257/691, 693, 257/698, 699, 208, 690, 210, 211, 601, 694

(56) References Cited

U.S. PATENT DOCUMENTS

| | | | |
|---|---|---|---|
| 3,984,860 A | * 10/1976 | Logue | ........................ 357/68 |
| 6,111,310 A | 8/2000 | Schultz | |
| 6,346,721 B1 | 2/2002 | Schultz | |
| 6,480,989 B2 | * 11/2002 | Chan et al. | ...................... 716/8 |
| 2001/0017407 A1 | * 8/2001 | Farnworth et al. | .......... 257/690 |

* cited by examiner

Primary Examiner—Long Pham
Assistant Examiner—Dana Farahani
(74) Attorney, Agent, or Firm—John R. Ley, LLC

(57) ABSTRACT

The subject matter described herein involves a wire bonded integrated circuit (IC) that includes a power distribution grid, or power redistribution bus, within a single layer, e.g. the topmost metallization layer, of the IC chip. Electrical conductors in the power distribution grid are generally L-shaped. Thus, the electrical conductors are arranged generally in symmetrical quadrants within which the electrical conductors extend from one side edge of the IC chip to a generally right-angled corner and then to a second side edge that is adjacent to the first side edge.

12 Claims, 3 Drawing Sheets

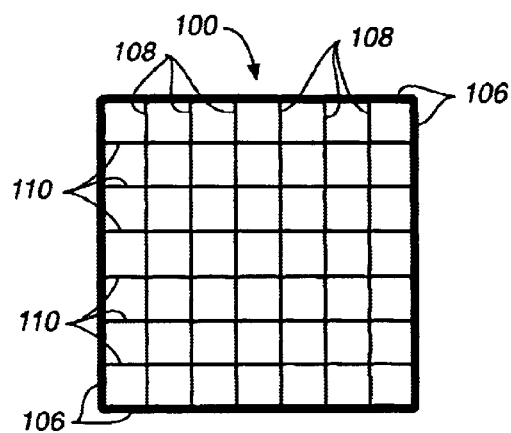
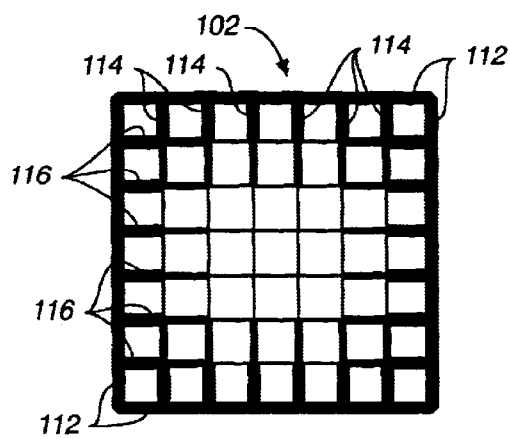
FIG._1 *(PRIOR ART)*  FIG._2 *(PRIOR ART)*
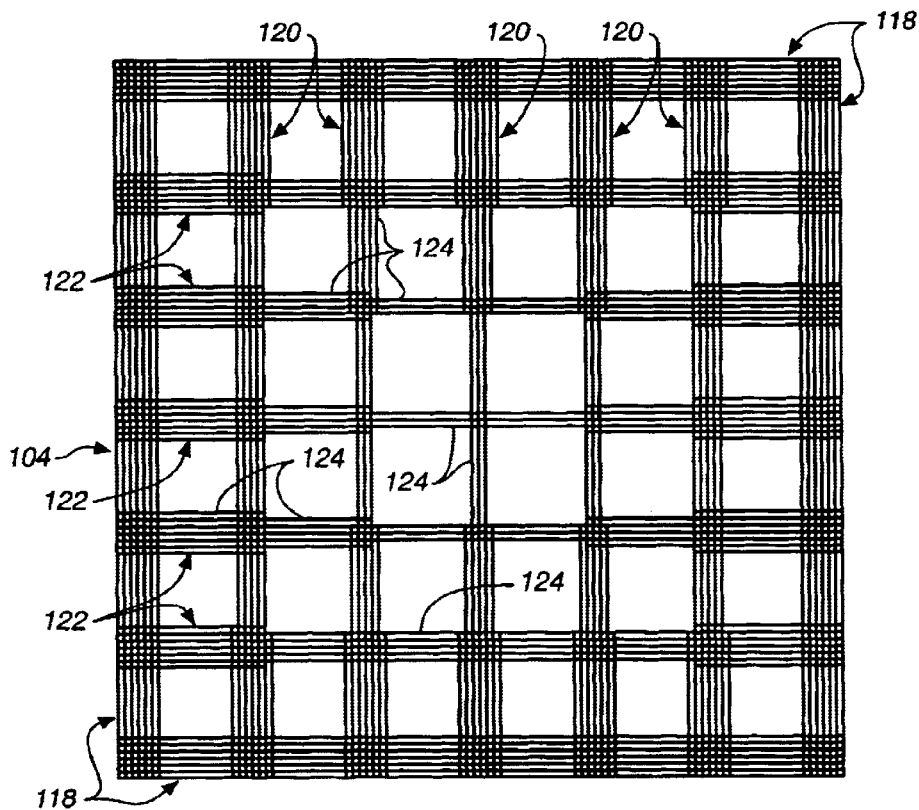
FIG._3 *(PRIOR ART)*

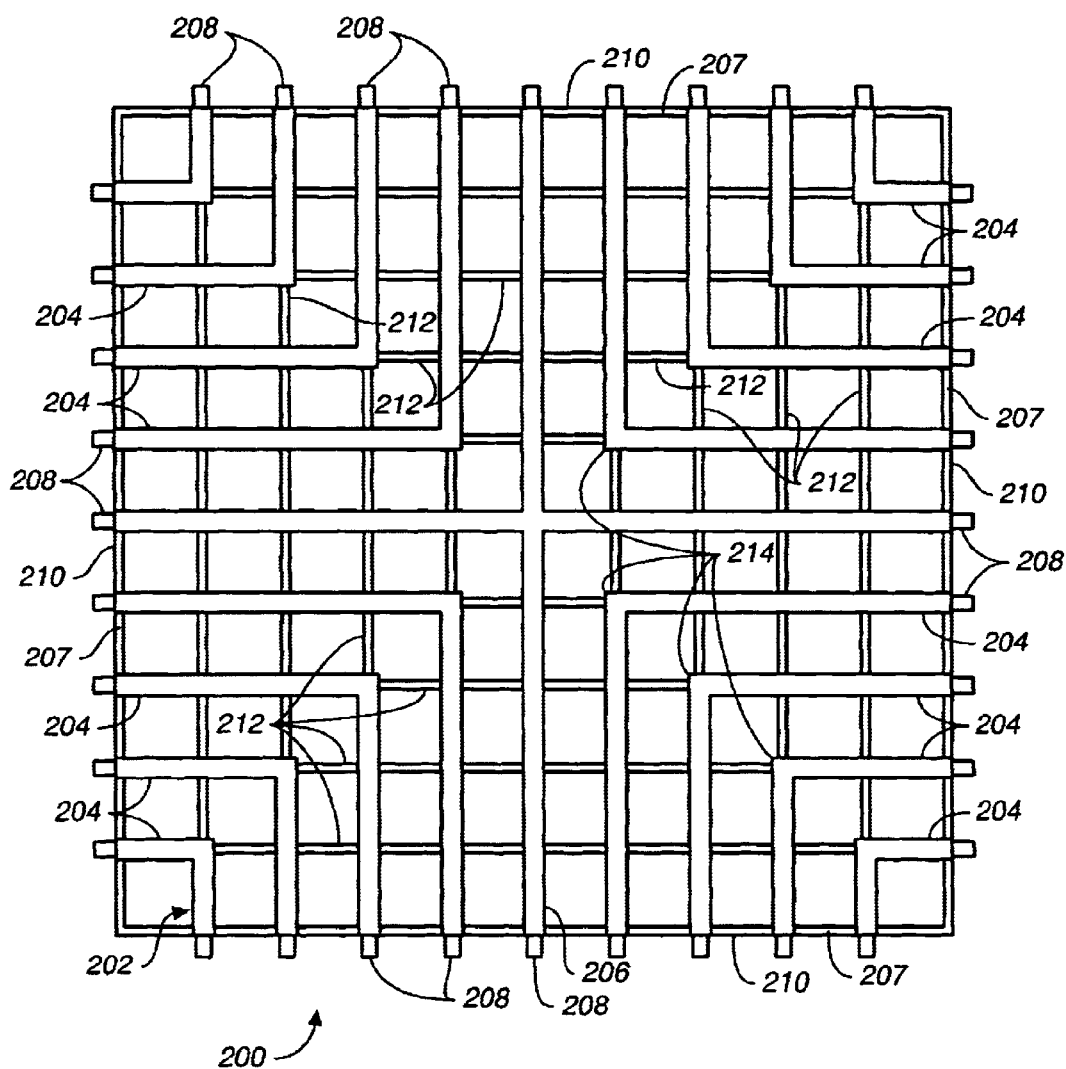
FIG._4

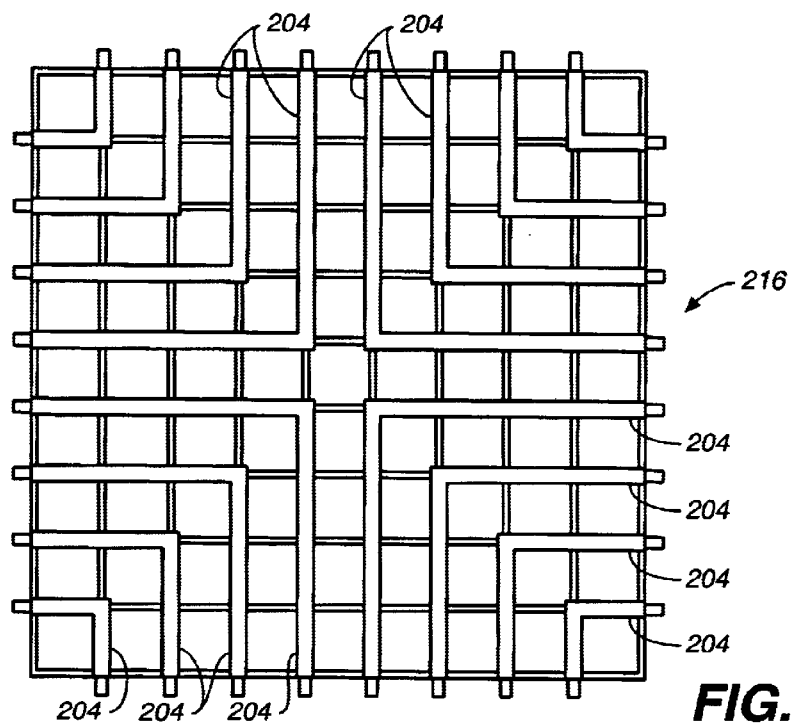
FIG._5
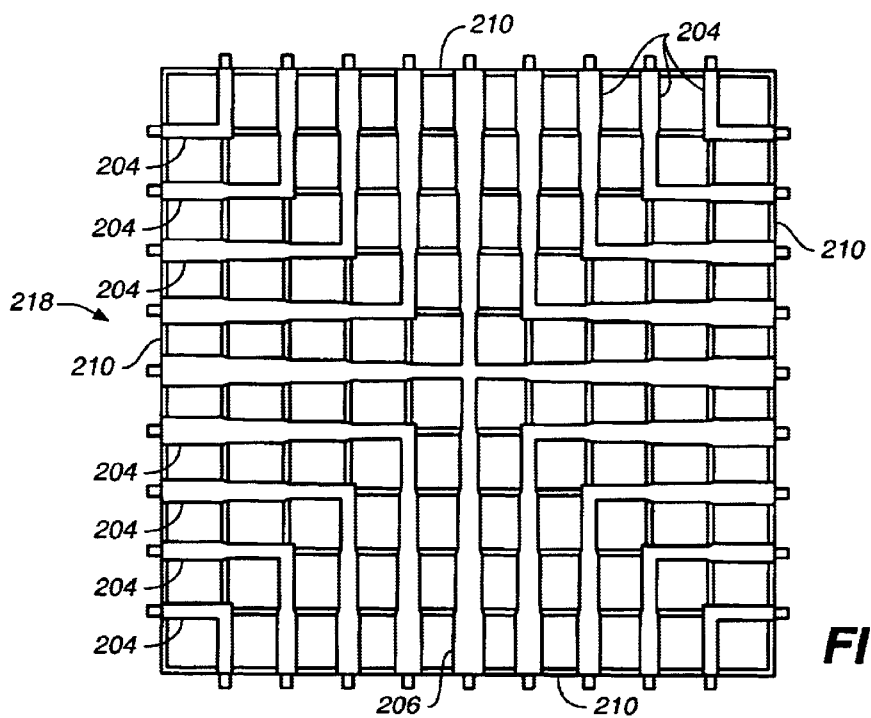
FIG._6

POWER REDISTRIBUTION BUS FOR A WIRE BONDED INTEGRATED CIRCUIT

FIELD

The subject matter herein relates to distribution of electrical power across an integrated circuit chip through a power grid layer.

BACKGROUND

An integrated circuit (IC) chip typically includes one or two primary layers of electrical conductors (e.g. aluminum, copper and other conductors), a.k.a. a "power redistribution bus" or power distribution grid, that provide gross distribution of electrical power across the IC chip. The power distribution grid typically transmits the electrical power through other layers of electrical conductors that distribute the electrical power more finely to the various electronic components (e.g. transistors, capacitors, etc.) in the various other layers of the IC chip.

Examples of such power distribution grids 100, 102 and 104, specifically for wire bonded IC's, are shown in FIGS. 1, 2 and 3, respectively. The power distribution grid 100 (FIG. 1) is similar to the grids 10 and 20 shown in prior art FIGS. 1 and 2 in U.S. Pat. No. 6,111,310. The power distribution grid 100 includes four main electrical conductors 106 arranged to form a square that generally corresponds to an outer perimeter of an IC (not shown) on which the power distribution grid 100 may be formed. The power distribution grid 100 also includes two sets of evenly spaced electrical conductors 108 and 110, one vertical set (electrical conductors 108) and one horizontal set (electrical conductors 110), that connect the main electrical conductors 106 on opposite sides of the outer perimeter of the IC. The electrical conductors 108 and 110 are generally perpendicular to each other and have a generally constant width. Additionally, the electrical conductors 108 are typically formed within a different layer of the IC than are the electrical conductors 110, so the electrical conductors 108 and 110 cannot intersect and cause an electrical short. Also, the electrical conductors 108 and 110 typically supply the electrical power to the IC, and another set of electrical conductors (not shown) disposed in the same two layers of the IC chip as the power electrical conductors 108 and 110 typically supplies the ground.

Since the electrical conductors 108 and 110 have a generally constant width, in order to deliver approximately the same current to each region of the IC chip, the current density must be considerably greater in the portion of the electrical conductors 108 and 110 near the periphery of the IC chip than in the center of the IC chip. The greater current density can result in electromigration if the cross-section of the electrical conductors 108 and 110 is too small near the periphery of the IC chip.

The power distribution grid 102 shown in FIG. 2 is similar to the power distribution grid 100 (FIG. 1) and to the grid 30 shown in FIG. 3 in U.S. Pat. No. 6,111,310. Similar to the power distribution grid 100, the power distribution grid 102 includes four main electrical conductors 112 arranged to form a square that generally corresponds to an outer perimeter of an IC (not shown) on which the power distribution grid 102 may be formed. The power distribution grid 100 also includes two sets of non-intersecting electrical conductors 114 and 116 that connect the main electrical conductors 112 on opposite sides of the outer perimeter of the IC chip. The electrical conductors 114 and 116 are generally perpendicular to each other. However, unlike the power distribution grid 100 shown in FIG. 1, the electrical conductors 114 and 116 have a varying width, instead of a constant width. In this manner, the problem with electromigration that may be experienced in the power distribution grid 100 is reduced in the power distribution grid 102. Additionally, the power distribution grid 102 exhibits less voltage drop than does the power distribution grid 100, so the power is more evenly distributed across the power distribution grid 102 than across the power distribution grid 100. The power distribution grid 102 is typically made from conductor material, such as aluminum, that can be formed in relatively wide lines.

The power distribution grid 104 shown in FIG. 3 is similar to the power distribution grid 102 (FIG. 2), except that the four main electrical conductors 118 (arranged to form a square that generally corresponds to an outer perimeter of an IC) and the two sets of non-intersecting variable-width conductors 120 and 122 are formed from multiple individual generally-constant-width electrical conductors 124. Having multiple individual electrical conductors 124 allows the power distribution grid 104 to be formed from conductor material, such as copper, that cannot readily be formed in relatively wide lines. Some of the individual electrical conductors 124 extend all the way across the IC chip (not shown), while the others extend only part way from the periphery of the IC chip toward the center of the IC chip. In this manner, the problem with electromigration that may be experienced in the power distribution grid 100 (FIG. 1) is reduced in the power distribution grid 104, because there are more of the individual electrical conductors 124 to transfer the current near the periphery of the IC chip where there is more current in the power distribution grid 104 than near the center of the IC chip.

The power distribution grids 100 (FIG. 1), 102 (FIG. 2) and 104 (FIG. 3) require exclusive use of at least two layers of the IC chip, which takes up valuable space within the IC chip and limits the vertical thickness of at least one of these two layers (increasing the layer's resistance), since a layer that is overlaid by another layer is inherently restricted in its vertical thickness due to physical limitations of chip fabrication processes. On the other hand, if the power distribution grids 100, 102 and 104 were made with only one set of electrical conductors (e.g. 108, 114 and 120) in only one layer of the IC chip, then the power distribution grids 100, 102 and 104 would receive current on only two sides of the IC chip, e.g. the top and bottom sides, which requires a relatively tight arrangement of power pins (not shown) on only two sides of the IC chip and results in an unsymmetrical voltage drop from a given point on the IC chip to the nearest main electrical conductor 106 (FIG. 1), 112 (FIG. 2) or 118 (FIG. 3) on the periphery of the IC chip.

It is with respect to these and other background considerations that the subject matter herein has evolved.

SUMMARY

The subject matter herein involves a power distribution grid that is formed in only one layer of an IC chip (e.g. the top layer), includes power pins on all four sides of the IC chip and results in a symmetrical voltage drop and current density in both the horizontal and vertical directions across the IC chip for a relatively even power distribution. The IC chip is generally divided into quadrants, each including one corner (top-left, top-right, bottom-right or bottom-left) of the IC chip and about half of the two side edges (top, bottom, left side and right side) that form the corner. Electrical conductors for each quadrant of the power distribution grid are routed from the side edge on one side of the corner of the IC chip to the side edge on the other side of the corner. Generally, the electrical conductors do not intersect each other, so the electrical conductors can be formed in the same layer of the IC chip.

In a particular embodiment, the electrical conductors of each quadrant are routed in general L-shapes from one IC chip side edge of the quadrant to the other IC chip side edge of the quadrant on the other side of the corner of the IC chip, without intersecting each other. The L-shaped electrical conductor nearest the corner of the IC chip in the quadrant is the shortest electrical conductor in the quadrant, and the L-shaped electrical conductor nearest the center of the IC chip is the longest electrical conductor in the quadrant. Additionally, the power distribution grid is generally symmetrical about the center point of the IC chip. Additionally, every other one of the L-shaped electrical conductors in each quadrant may be power conductors separated by ground conductors, so that all four side edges of the IC chip may have power and ground pins, resulting in the symmetrical voltage drop and current density and the relatively even power distribution across the IC chip.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWING

FIG. 1 is a plan view of a prior art power distribution grid.

FIG. 2 is a plan view of another prior art power distribution grid.

FIG. 3 is a plan view of another prior art power distribution grid.

FIG. 4 is a plan view of an integrated circuit (IC) chip including a power distribution grid incorporating the present invention.

FIG. 5 is a plan view of an integrated circuit (IC) chip including an alternative power distribution grid incorporating the present invention.

FIG. 6 is a plan view of another integrated circuit (IC) chip including another alternative power distribution grid incorporating the present invention.

DETAILED DESCRIPTION

An integrated circuit (IC) chip 200, as shown in FIG. 4, includes a power distribution grid, or power redistribution bus, 202 having several L-shaped electrical conductors 204 and a center electrical conductor 206 that extend inward across the IC chip from an outer conductor 207 that connects to power pins 208 at side edges 210 of the IC chip 200 without intersecting each other. The IC chip 200, including the power distribution grid 202, is formed using conventional IC chip fabrication techniques. The power pins 208 are typically for wire bonding the IC chip 200 to an external power source (not shown). The electrical conductors 204 and 206 supply electrical power to electronic components (not shown) in the IC chip 200, typically through a variety of additional conductors 212 in other layers of the IC chip 200, to enable the functioning of the IC chip 200. Additionally, the electrical conductors 204 and 206 are typically interleaved with ground electrical conductors (not shown). Furthermore, all of the electrical conductors 204 and 206 (and the ground electrical conductors) are disposed in the same conductor layer (not shown), such as the top metallization layer, of the IC chip 200. In this manner, the power distribution grid 202 requires a smaller die size for the IC chip 200 and less cost than does the prior art. Additionally, the power pins 208 may be evenly distributed on all of the side edges 210 of the IC chip 200, rather than having all power pins on only two sides of the IC chip 200.

The center electrical conductor 206 effectively separates the IC chip 200 and power distribution grid 202 into four generally symmetrical quadrants, each bounded by a portion of the center electrical conductor 206 and a portion of two adjacent side edges 210. The L-shaped electrical conductors 204 are each confined to one quadrant and extend generally perpendicularly from the side edges 210 of the quadrant to a generally right-angled corner 214 without intersecting another L-shaped electrical conductor 204 or the center electrical conductor 206. In this manner, the voltage drop and current density in both the horizontal and vertical directions across the IC chip 200 are generally symmetrical. Additionally, the symmetry results in a relatively even power distribution across the IC chip 200.

Being in the topmost layer of the IC chip 200, such as the top metallization layer, the electrical conductors 204 and 206 are as not restricted in their height as they would be if they were disposed in an intermediate layer of the IC chip 200. The prior art electrical conductors 108 and 110 (FIG. 1), 114 and 116 (FIG. 2) and 120 and 122 (FIG. 3), on the other hand, have to be disposed in two layers of the IC chip, so that they don't intersect each other. Therefore, the prior art electrical conductors 108, 110, 114, 116, 120 and 122 that are overlaid by another layer of the IC chip are more restricted in their maximum height, due to physical limitations in the fabrication processes by which the IC chips are formed. Such restrictions also limit the conductivity of the electrical conductors 108, 110, 114, 116, 120 and 122. Since the electrical conductors 204 and 206 are not as restricted, however, their conductivity is relatively high, so the power distribution grid 202 can be formed in only one layer. Additionally, the additional conductors 212 and any other signal conductors (not shown) are not formed in the same layer of the IC chip 200 as the electrical conductors 204 and 206, so the electrical conductors 204 and 206 can be routed in both the horizontal and vertical directions without affecting other conductors.

Since the electrical conductors 204 and 206 can be routed both horizontally and vertically, power and ground can be supplied at all four side edges 210 of the IC chip 200. Thus, current can be supplied to and removed from every point on the IC chip 200 generally in the most efficient manner, i.e. at the nearest side edge 210, and result in a relatively low overall voltage drop and current density across the IC chip 200. Furthermore, having the power and ground supplied on all four sides of the IC chip 200 results in the voltage drop and current density being generally symmetrical and distributed relatively evenly across the IC chip 200. Thus, the power distribution grid 202 allows greater flexibility in placement of the power-consuming electronic components throughout the IC chip 200, because the more symmetrical, even distribution of voltage and current can handle greater variations in voltage and current changes than can the prior art. Additionally, the greater thickness of the electrical conductors 204 and 206, resulting in the lower current density and more even distribution, relieves the electromigration problems more efficiently, relative to die size, than does the prior art.

Alternative power distribution grids 216 and 218 are shown in FIGS. 5 and 6, respectively. The alternative power distribution grids 216 and 218 have all the same advantages described above with respect to the power distribution grid 202 (FIG. 4), but with slight variations in structure. The power distribution grid 216, for instance, includes the L-shaped electrical conductors 204, but not the center electrical conductor 206 (FIG. 4). The power distribution grid 218, on the other hand, includes both the L-shaped electrical conductors 204 and the center electrical conductor 206, but each of the electrical conductors 204 and 206 have a step-tapered width. The widest portions of the electrical conductors 204 and 206 are at the ends near the side edges 210, and the narrowest portions are at the centers of the electrical conductors 204 and 206. In this manner, voltage drop, current density and potential electromigration effects are further alleviated or reduced. A further alternative power distribution grid (not shown), which also further alleviates or reduces the voltage drop, current density and potential electromigration effects, may include several individual electrical conductors 124 (FIG. 3) of different lengths most heavily concentrated near the side edges 210.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A power distribution grid for a wire bonded integrated circuit (IC) chip, having a plurality of electronic components disposed therein and a plurality of power pins disposed in a periphery thereof, comprising:
   a single conductor layer through which electrical power is distributed from the power pins to the electronic components of the IC chip, wherein the single conductor layer includes a topmost layer of the IC chip; and
   a plurality of generally L-shaped electrical conductors disposed in the single conductor layer for conducting the electrical power throughout the single conductor layer, the L-shaped electrical conductors being spaced apart from each other and not intersecting each other, the L-shaped electrical conductors being connected to the power pins.

2. A power distribution grid for a wire bonded integrated circuit (IC) chip, having a plurality of electronic components disposed therein and a plurality of power pins disposed in a periphery thereof, comprising:
   a single conductor layer through which electrical power is distributed from the power pins to the electronic components of the IC chip, wherein the single conductor layer includes a topmost layer of the IC chip, wherein the single conductor layer includes a plurality of side edges along the periphery, a plurality of corners defined by adjacent side edges, and a plurality of quadrants that are generally symmetrical to each other, and each quadrant includes a portion of two adjacent side edges and the corner defined thereby; and
   a plurality of generally L-shaped electrical conductors disposed in the single conductor layer for conducting the electrical power throughout the single conductor layer, the L-shaped electrical conductors being spaced apart from each other and not intersecting each other, the L-shaped electrical conductors being connected to the power pins, wherein each L-shaped electrical conductor is confined to one of the quadrants and extends from a first one of the two adjacent side edges to a second one of the two adjacent side edges.

3. A power distribution grid as defined in claim 1 wherein:
   the periphery of the IC chip includes a plurality of side edges; and
   each of the L-shaped electrical conductors connects to the power pins disposed on different adjacent side edges of the IC chip.

4. A power distribution grid as defined in claim 3 further comprising:
   an outer conductor extending along the periphery of the IC chip and connecting to the L-shaped electrical conductors and to the power pins to transfer the electrical power from the power pins to the L-shaped electrical conductors.

5. A power distribution grid as defined in claim 1 wherein:
   the periphery of the IC chip includes a plurality of side edges and a plurality of corners defined by adjacent side edges;
   the IC chip includes a plurality of quadrants that are generally symmetrical to each other and each quadrant includes a portion of two adjacent side edges and the corner defined thereby; and
   each L-shaped electrical conductor is confined to one of the quadrants and extends from a first one of the two adjacent side edges to a second one of the two adjacent side edges.

6. A power distribution grid as defined in claim 5 further comprising:
   a center electrical conductor extending from a center of the power distribution grid to about a center of each side edge and separating each of the quadrants.

7. A power distribution grid as defined in claim 1 wherein:
   each L-shaped electrical conductor includes two end portions that have a first width and a center portion that has a second width narrower than the first width, the center portion being further from the periphery of the IC chip than are the end portions.

8. A power distribution grid as defined in claim 1 wherein the power distribution conductor layer further comprises at least one ground conductor for distributing electrical power with the L-shaped electrical conductors.

9. A power distribution grid as defined in claim 2 further comprising:
   an outer conductor extending along the periphery of the IC chip and connecting to the L-shaped electrical conductors and to the power pins to transfer the electrical power from the power pins to the L-shaped electrical conductors.

10. A power distribution grid as defined in claim 2 further comprising:
    a center electrical conductor extending from a center of the power distribution grid to about a center of each side edge and separating each of the quadrants.

11. A power distribution grid as defined in claim 2 wherein:
    each L-shaped electrical conductor includes two end portions that have a first width and a center portion that has a second width narrower than the first width, the center portion being further from the periphery of the IC chip than are the end portions.

12. A power distribution grid as defined in claim 2 wherein the power distribution conductor layer further comprises at least one ground conductor for distributing electrical power with the L-shaped electrical conductors.

* * * * *